United States Patent
Kubota

(10) Patent No.: US 9,716,098 B2
(45) Date of Patent: Jul. 25, 2017

(54) SEMICONDUCTOR DEVICE AND MANUFACTURING METHOD THEREOF

(71) Applicant: Kabushiki Kaisha Toshiba, Minato-ku (JP)

(72) Inventor: Hiroshi Kubota, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/070,726

(22) Filed: Mar. 15, 2016

(65) Prior Publication Data

US 2017/0069645 A1 Mar. 9, 2017

Related U.S. Application Data

(60) Provisional application No. 62/214,417, filed on Sep. 4, 2015.

(51) Int. Cl.
*H01L 27/11* (2006.01)
*H01L 27/11556* (2017.01)
*H01L 29/51* (2006.01)
*H01L 29/49* (2006.01)
*H01L 21/8234* (2006.01)

(52) U.S. Cl.
CPC ............ *H01L 27/11556* (2013.01); *H01L 21/823475* (2013.01); *H01L 29/495* (2013.01); *H01L 29/51* (2013.01)

(58) Field of Classification Search
CPC .................................... H01L 27/11556
See application file for complete search history.

(56) References Cited

U.S. PATENT DOCUMENTS

| 6,127,231 A * | 10/2000 | Mori .............. H01L 21/823443 257/E21.622 |
| 2003/0162354 A1 * | 8/2003 | Hashimoto ....... H01L 21/02063 438/257 |
| 2012/0070944 A1 | 3/2012 | Kim et al. |
| 2012/0108048 A1 | 5/2012 | Lim et al. |
| 2012/0184078 A1 * | 7/2012 | Kiyotoshi .......... H01L 27/1157 438/268 |
| 2014/0070302 A1 * | 3/2014 | Yoo .................... H01L 27/1157 257/324 |
| 2015/0179660 A1 | 6/2015 | Yada et al. |
| 2016/0093513 A1 * | 3/2016 | Hong ............... H01L 21/32139 438/637 |

* cited by examiner

*Primary Examiner* — Scott B Geyer
*Assistant Examiner* — S. M. S. Imtiaz
(74) *Attorney, Agent, or Firm* — Oblon, McClelland, Maier & Neustadt, L.L.P.

(57) ABSTRACT

According to one embodiment, a semiconductor device includes a semiconductor substrate and a laminated body. The laminated body is disposed on the semiconductor substrate. The laminated body includes a plurality of conducting layers and a first interlayer insulating film. The first interlayer insulating film is disposed between the plurality of conducting layers. A second interlayer insulating film is formed to cover this laminated body. The second interlayer insulating film includes boron.

20 Claims, 13 Drawing Sheets

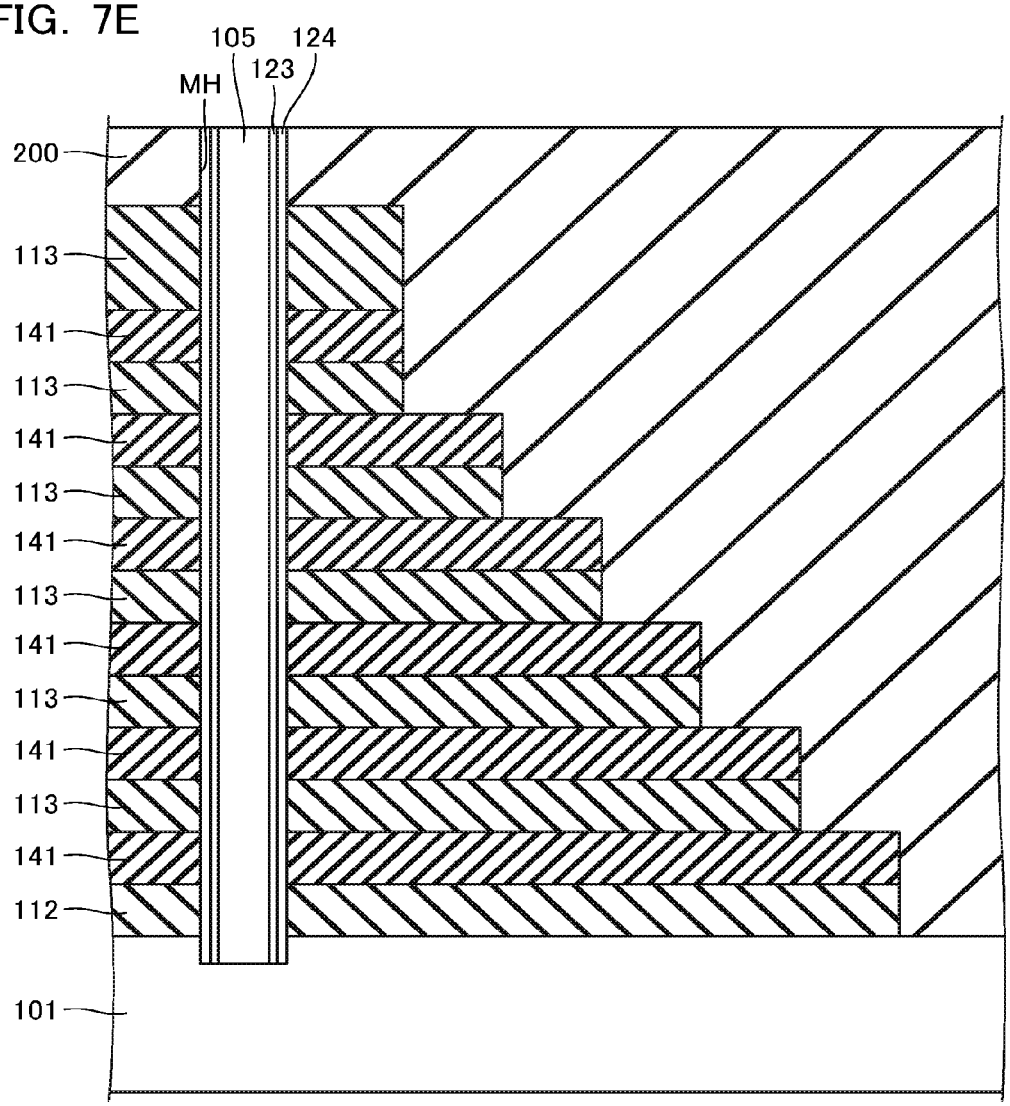

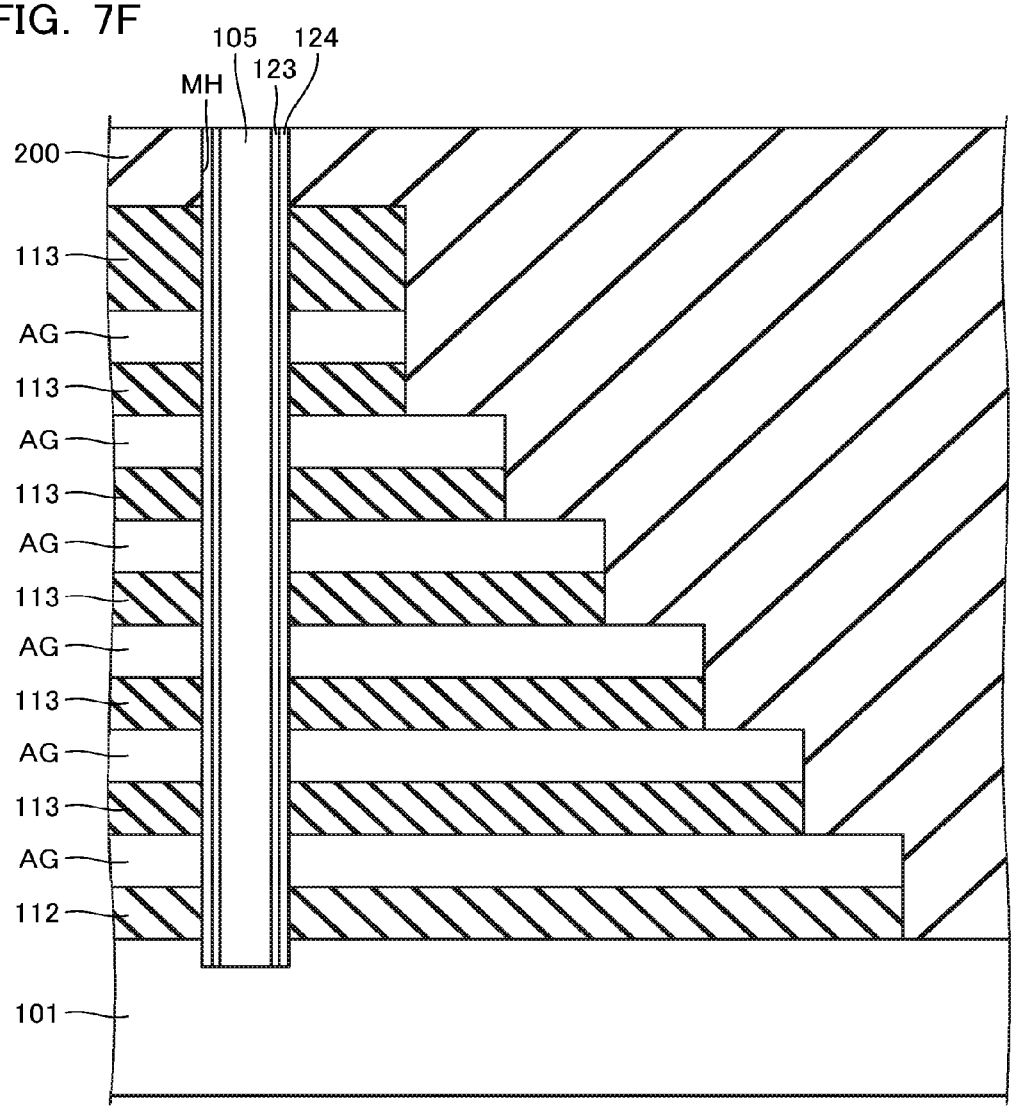

SEMICONDUCTOR DEVICE AND MANUFACTURING METHOD THEREOF

This application is based on and claims the benefit of priority from prior US prior provisional Patent Application No. 62/214,417, filed on Sep. 4, 2015, the entire contents of which are incorporated herein by reference.

BACKGROUND

Field

Embodiments described herein relate generally to a semiconductor device and a manufacturing method thereof.

Description of the Related Art

Semiconductor devices, for example, a semiconductor memory device such as a NAND flash memory, are required to be further downsized and have a larger storage capacity. While scaling down for enhancing the capacity has been done, on the other hand, there has been proposed a structure in which semiconductor elements such as memory cells are disposed three-dimensionally. For example, in such three-dimensional semiconductor memory device, the memory cells are disposed in a laminating direction. Conducting layers extend from the respective memory cells, which are disposed in the laminating direction.

This three-dimensional semiconductor memory device has a problem that as increasing the thickness of the laminating direction, the stress generated by the laminate material increases the warping of the laminated structure.

BRIEF DESCRIPTION OF THE DRAWINGS

FIG. 7A to FIG. 7F are process drawings illustrating manufacturing processes of the semiconductor memory device according to the first embodiment;

DETAILED DESCRIPTION

According to one embodiment, a semiconductor device includes a semiconductor substrate and a laminated body. The laminated body is disposed on the semiconductor substrate. The laminated body includes a plurality of conducting layers and a first interlayer insulating film. The first interlayer insulating film is disposed between the plurality of conducting layers. A second interlayer insulating film is formed to cover this laminated body. The second interlayer insulating film includes boron.

The following describes the semiconductor memory device according to the embodiments with reference to the accompanying drawings. Here, these embodiments are only examples. For example, a non-volatile semiconductor memory device described below has a structure where a memory string extends in a straight line in the vertical direction with respect to a substrate. The similar structure is also applicable to the structure having a U shape where a memory string is folded back to the opposite side in the middle. The respective drawings of the non-volatile semiconductor memory devices used in the following embodiments are schematically illustrated. The thickness, the width, the ratio, and similar parameter of the layer are not necessarily identical to actual parameters.

The following embodiments relate to a non-volatile semiconductor memory device in a structure where a plurality of Metal-Oxide-Nitride-Oxide-Semiconductor (MONOS) type memory cells (transistors) is disposed in a height direction. The MONOS type memory cell includes: a semiconductor film disposed in a columnar shape vertical to the substrate as a channel, and a gate electrode film disposed on the side surface of the semiconductor film via an electric charge accumulating layer. However, a similar structure is applicable to another type, for example, a semiconductor-oxide-nitride-oxide-semiconductor (SONOS) type memory cell, a metal-aluminum oxide-nitride-oxide-semiconductor (MANOS) type memory cell, a memory cell that uses hafnium oxide ($HfO_x$) or tantalum oxide ($TaO_x$) as an insulating layer, or a floating-gate type memory cell.

First Embodiment

First, the following describes an overall structure of a semiconductor memory device according to the first embodiment.

Figure 1:
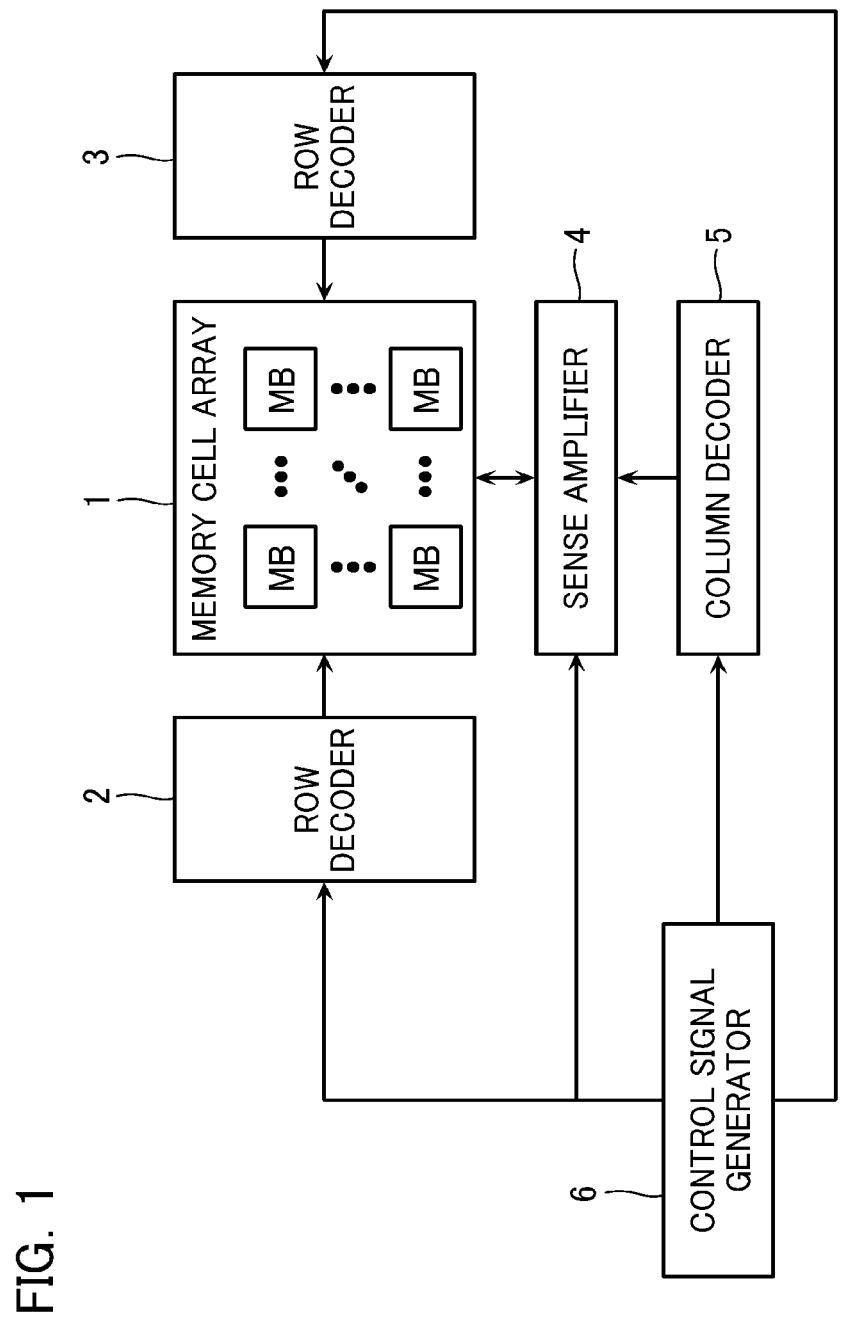
FIG. 1 is a function block diagram of a semiconductor memory device according to a first embodiment.

FIG. 1 is a function block diagram of a semiconductor memory device according to the first embodiment. This semiconductor memory device includes a memory cell array 1, row decoders 2 and 3, a sense amplifier 4, a column decoder 5, and a control signal generator 6.

The memory cell array 1 includes a plurality of memory blocks MB. The memory blocks MB each include a plurality of memory transistors. The memory transistors are a plurality of memory cells MC that are three-dimensionally disposed. The memory block MB is the smallest unit of data erasure operation.

The row decoders 2 and 3 decode retrieved block address signals or similar signals to control a writing operation and a reading operation of data in the memory cell array 1. The sense amplifier 4 detects electric signals flowing through a bit line during the reading operation and amplifies the electric signals. The column decoder 5 decodes column address signals to control the sense amplifier 4. The control signal generator 6 steps up a reference voltage to generate a high voltage used for the writing operation and the erasure operation. Besides, the control signal generator 6 generates control signals to control the row decoders 2 and 3, the sense amplifier 4, and the column decoder 5.

Figure 2:
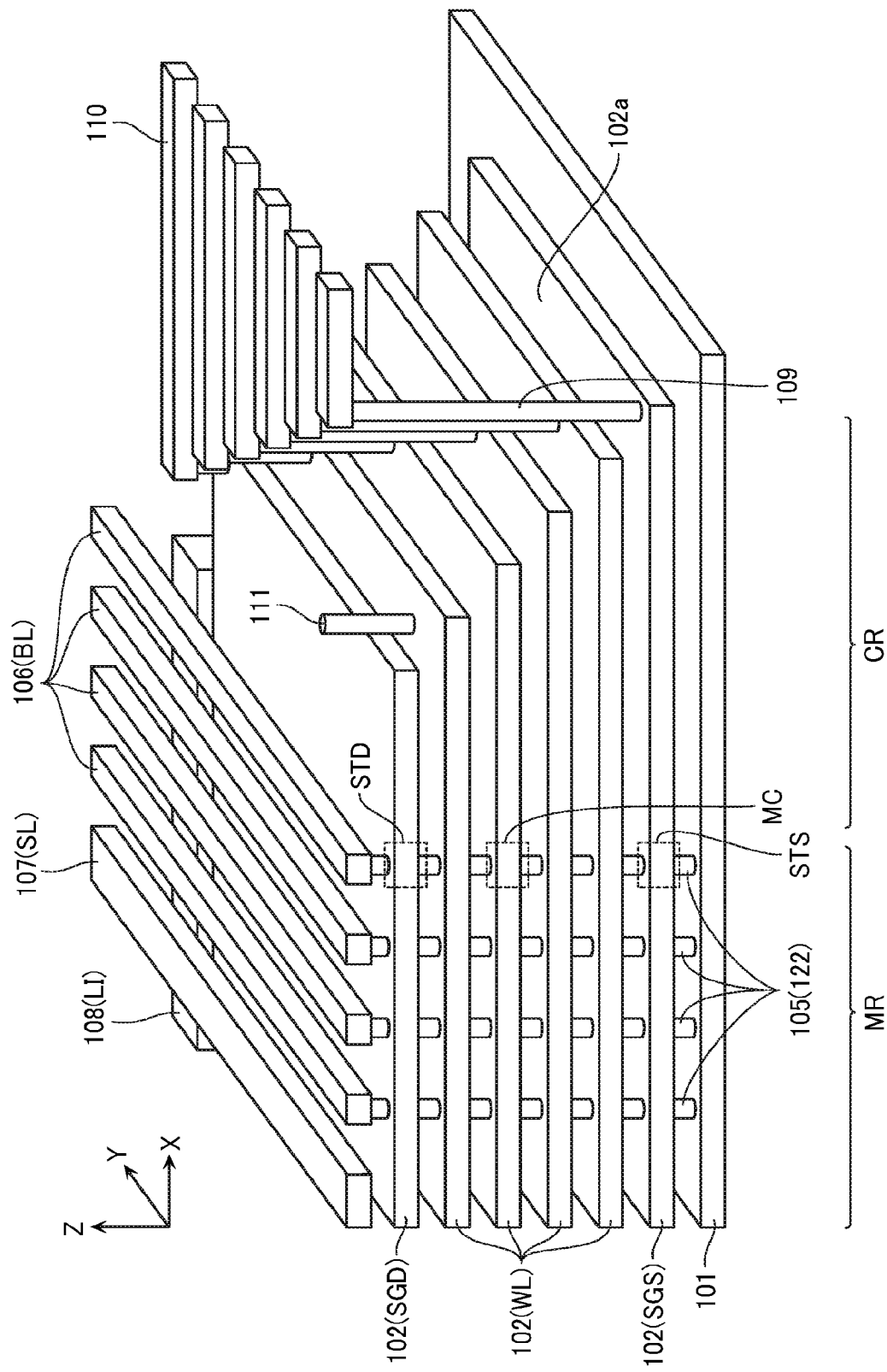
FIG. 2 is a schematic perspective view illustrating a configuration of a part of a memory cell array of the semiconductor memory device according to the first embodiment.

Next, the following describes the schematic structure of the memory cell array 1 according to the embodiment with reference to FIG. 2. FIG. 2 is a schematic perspective view illustrating the structure of a part of the memory cell array 1. FIG. 2 omits illustrations of a part of structures for simplifying the description. For simplifying the illustration, the numbers of respective wirings also differ from those of other drawings.

As illustrated in FIG. 2, the memory cell array 1 according to the first embodiment includes a substrate 101 and a plurality of conducting layers 102. The conducting layers 102 are laminated on the substrate 101 in a Z direction. The memory cell array 1 has a plurality of memory columnar bodies 105 extending in the Z direction. As illustrated in FIG. 2, the intersection portions of the conducting layers 102 and the memory columnar bodies 105 function as a source side selection gate transistor STS, the memory cell MC, or a drain side selection gate transistor STD. The conducting layer 102 is a conducting layer made of, for example, tungsten (W) and polysilicon. The conducting layer 102 functions as a word line WL, a source side selection gate line SGS, and a drain side selection gate line SGD.

As illustrated in FIG. 2, the plurality of conducting layers 102 include wiring parts, which are formed into a stepped pattern, on the end portions in the X direction. The following designates an area at which the memory cell MC or a similar component is disposed as a memory area MR. A part where the conducting layers 102 are formed into the stepped pattern by extracting the conducting layers 102 from this memory area MR is referred to as a stepped wiring area CR.

The conducting layers 102 in the stepped wiring area CR includes contact portions 102a. The contact portion 102a does not face the lower surface of the conducting layer 102 which is positioned on the upper layer thereof. The conducting layer 102 is connected to a contact plug 109 at this contact portion 102a. A wiring 110 is disposed at the upper end of the contact plug 109. The contact plug 109 and the wiring 110 are conducting layers made of, for example, tungsten.

As illustrated in FIG. 2, the memory cell array 1 according to the first embodiment includes a support pillar 111. The support pillar 111 is disposed so as to have a longitudinal direction in a laminating direction (z direction) of a laminated body formed of the plurality of conducting layers 102 and the interlayer insulating layers between the conducting layers 102. This support pillar 111 is formed to maintain the posture of the laminated body during the manufacturing process for this laminated body formed of the conducting layers 102 and the interlayer insulating layers between the conducting layers 102. When the material of the conducting layer 102 is metallic material such as tungsten, the conducting layers 102 can be formed by the following processes as described later. The interlayer insulating layers and sacrificial layers are laminated. Then, the sacrificial layers are removed by wet etching or a similar method. Afterward, the conducting films are embedded into voids formed by removing the sacrificial layers. This ensures the laminated structure constituted of the conducting layers and the interlayer insulating films to be formed. When performing such processes, to prevent the interlayer insulating layer from collapsing after the sacrificial films are removed, the above-described support pillar 111 is disposed. FIG. 2 representatively illustrates only the one support pillar 111. However, as described later, the actual device can include more of the support pillars 111.

As illustrated in FIG. 2, the memory cell array 1 according to the first embodiment includes a conducting layer 108. The conducting layer 108 opposes the side surfaces of the plurality of conducting layers 102 in the Y direction and extends in the X direction. The lower surface of the conducting layer 108 is in contact with the substrate 101. The conducting layer 108 is a conducting layer made of, for example, tungsten (W). The conducting layer 108 functions as a source contact LI.

The material of the conducting layer 102, as well as the above-described tungsten (W), may be constituted of a conducting layer such as WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$.

As illustrated in FIG. 2, the memory cell array 1 according to the first embodiment includes a plurality of conducting layers 106 and a conducting layer 107. The plurality of conducting layers 106 and the conducting layer 107 are disposed above the plurality of conducting layers 102 and memory columnar bodies 105. The plurality of conducting layers 106 are disposed in the X direction. The plurality of conducting layers 106 and the conducting layers 107 extend in the Y direction. The memory columnar bodies 105 are each connected to the lower surfaces of the conducting layers 106. The conducting layer 106 is, for example, constituted of the conducting layer such as tungsten (W) and functions as a bit line BL. The conducting layer 108 is connected to the lower surfaces of the conducting layers 107. The conducting layer 107 is, for example, constituted of the conducting layer such as tungsten (W) and functions as a source line SL.

Figure 3:
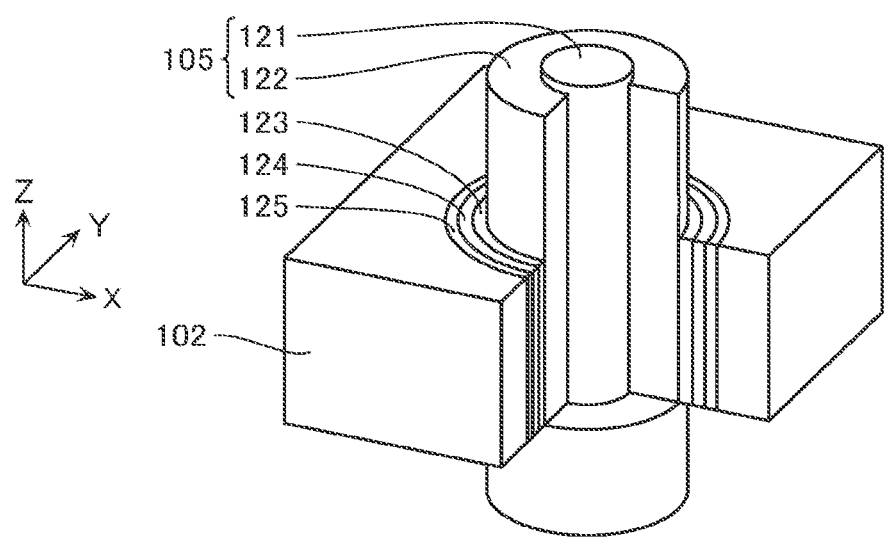
FIG. 3 is a schematic diagram illustrating a schematic configuration of a memory cell MC of the semiconductor memory device according to the first embodiment.

Next, with reference to FIG. 3, the following describes the schematic structure of the memory cell MC according to the first embodiment. FIG. 3 is a schematic perspective view illustrating the structure of the memory cell MC. FIG. 3 illustrates the structure of the memory cell MC. Note that the source side selection transistor STS and the drain side selection transistor STD may also be constituted similar to the memory cell MC. FIG. 3 omits a part of the structure.

As illustrated in FIG. 3, the memory cell MC is disposed at an intersecting portion of the conducting layer 102 and the memory columnar body 105. The memory columnar body 105 includes a core insulating layer 121 and a columnar semiconductor layer 122. The semiconductor layer 122 covers the sidewall of the core insulating layer 121. Moreover, between the semiconductor layer 122 and the conducting layer 102, a memory gate insulating film is disposed. The memory gate insulating film includes a tunnel insulating layer 123, an electric charge accumulating layer 124, and a block insulating layer 125. The core insulating layer 121 is constituted of, for example, an insulating layer such as silicon oxide ($SiO_2$). The semiconductor layer 122 is constituted of, for example, a semiconductor layer such as polysilicon. The semiconductor layer 122 functions as a channel for the memory cell MC, the source side selection transistor STS, and the drain side selection gate transistor STD. The tunnel insulating layer 123 is constituted of, for example, an insulating layer such as silicon oxide ($SiO_2$). The electric charge accumulating layer 124 is constituted of, for example, an insulating layer such as silicon nitride (SiN) that can accumulate electric charges. The block insulating layer 125 is constituted of, for example, an insulating layer such as silicon oxide ($SiO_2$).

The material of the semiconductor layer 122, in addition to the above-described polysilicon, for example, may be constituted of a semiconductor such as SiGe, SiC, Ge, and C. Silicide may be formed on contact surfaces between the semiconductor layers 122 and the substrate 101 and between the semiconductor layers 122 and the conducting layer 106. As such silicide, for example, it is considered that Sc, Ti, VCr, Mn, Fe, Co, Ni, Cu, Zn, Rh, Pd, Ag, Cd, In, Sn, La, Hf, Ta, W, Re, Os, Ir, Pt, and Au are used. Further, to the silicide thus formed, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, or a similar material may be added.

The tunnel insulating layer 123 and the block insulating layer 125 are possibly consisted of, for example, a material such as oxide and oxynitride, in addition to the above-described silicon oxide ($SiO_2$). The oxide constituting the tunnel insulating layer 123 and the block insulating layer 125 may be $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a similar material. The oxide constituting the tunnel insulating layer 123 and the block insulating layer 125 may also be $AB_2O_4$. Note that A and B described here are identical or different elements and one of elements among Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $Co_{1+x}Al_{2-x}O_{4+y}$, $MnO_x$ or a similar material.

The oxide constituting the tunnel insulating layer 123 and the block insulating layer 125 may be $ABO_3$. Note that A and B described here are identical or different elements and one of elements among Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is $LaAlO_3$, $SrHfO_3$, $SrZrO_3$, $SrTiO_3$, or a similar material.

The oxynitride constituting the tunnel insulating layer 123 and the block insulating layer 125 may be, for example, SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, and AlSiON.

The oxynitride constituting the tunnel insulating layer 123 and the block insulating layer 125 may be a material constituted by replacing some of oxygen elements of the respective materials described above as an oxide constituting the tunnel insulating layer 123 and the block insulating layer 125 with a nitrogen element.

As the material for the tunnel insulating layer 123 and the block insulating layer 125, $SiO_2$, SiN, $Si_3N_4$, $Al_2O_3$, SiON, $HfO_2$, HfSiON, $Ta_2O_5$, $TiO_2$, or $SrTiO_3$ is preferable.

In particular, regarding silicon-based insulating films such as $SiO_2$, SiN, and SiON, the respective concentrations of the oxygen elements and the nitrogen elements can be set to be equal to or more than $1 \times 10^{18}$ atoms/cm$^3$. However, the barrier heights of the plurality of insulating layers are different from one another.

The tunnel insulating layer 123 and the block insulating layer 125 can include a material including impurity atoms that forms a defect level or semiconductor/metal dots (the quantum dots).

Figure 4:
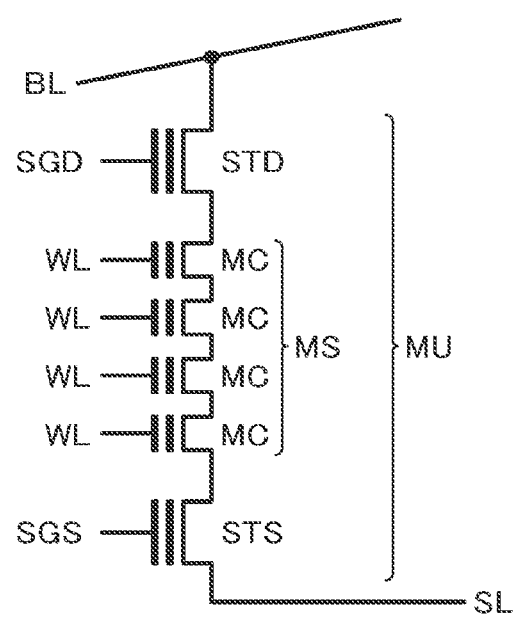
FIG. 4 is an equivalent circuit diagram of a memory unit MU of the semiconductor memory device according to the first embodiment.

The connection of the memory cell MC and the selection transistors STD and STS with the above-described structure in series constitutes a memory unit MU as illustrated in FIG. 4. That is, the memory unit MU includes a memory string MS, the source side selection transistor STS, and the drain selection transistor STD. The memory string MS is formed of the plurality of memory cells MC connected in series. The source side selection transistor STS and the drain selection transistor STD are connected to both ends of the memory string MS. Some of the plurality of memory cells MC in the memory string MS can be dummy cells not used for data storage. The number of dummy cells can be set to any given number.

Figure 5:
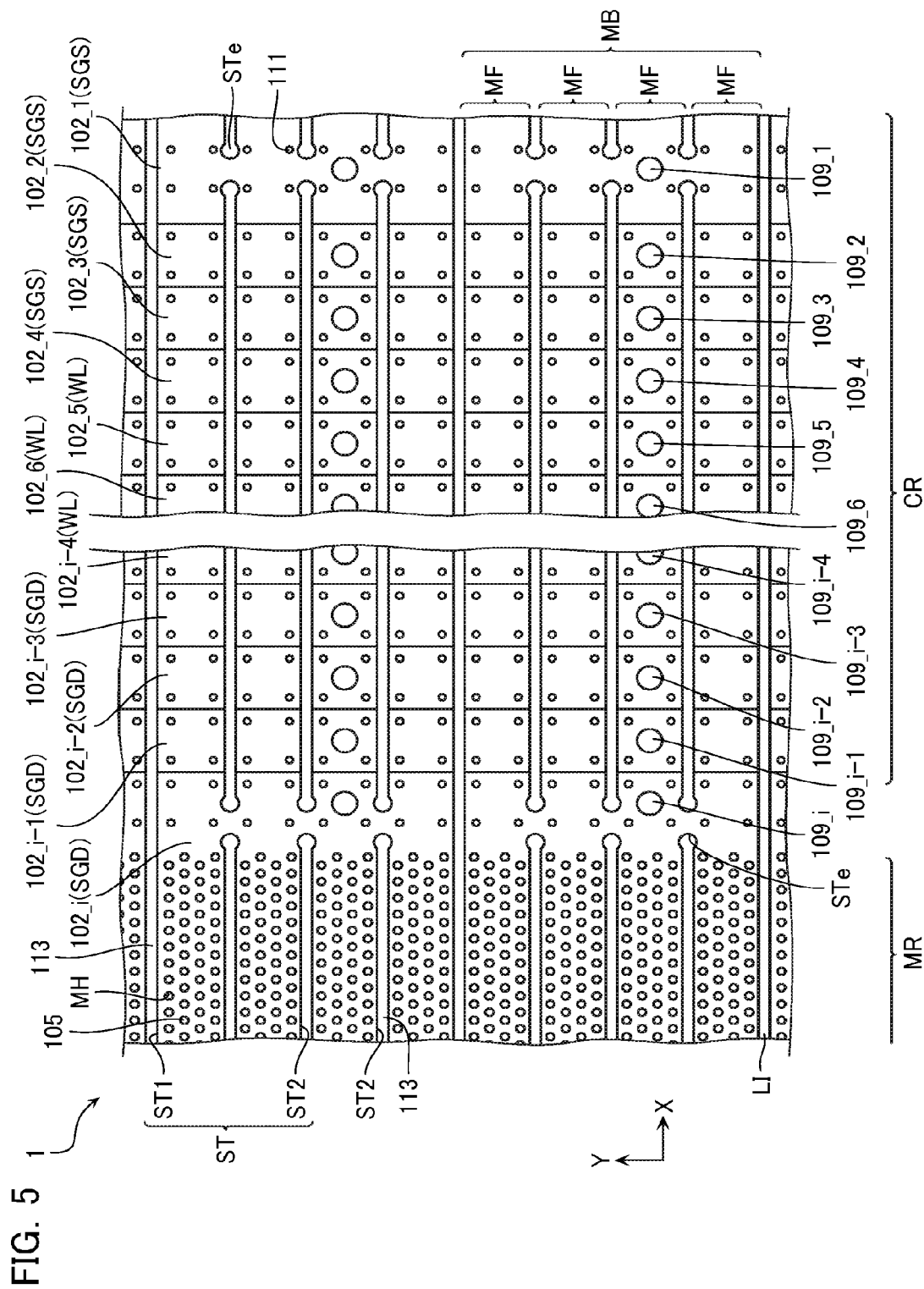
FIG. 5 is a plan view describing detailed configurations of a memory area MR and a stepped wiring area CR of the semiconductor memory device according to the first embodiment.
Figure 6:
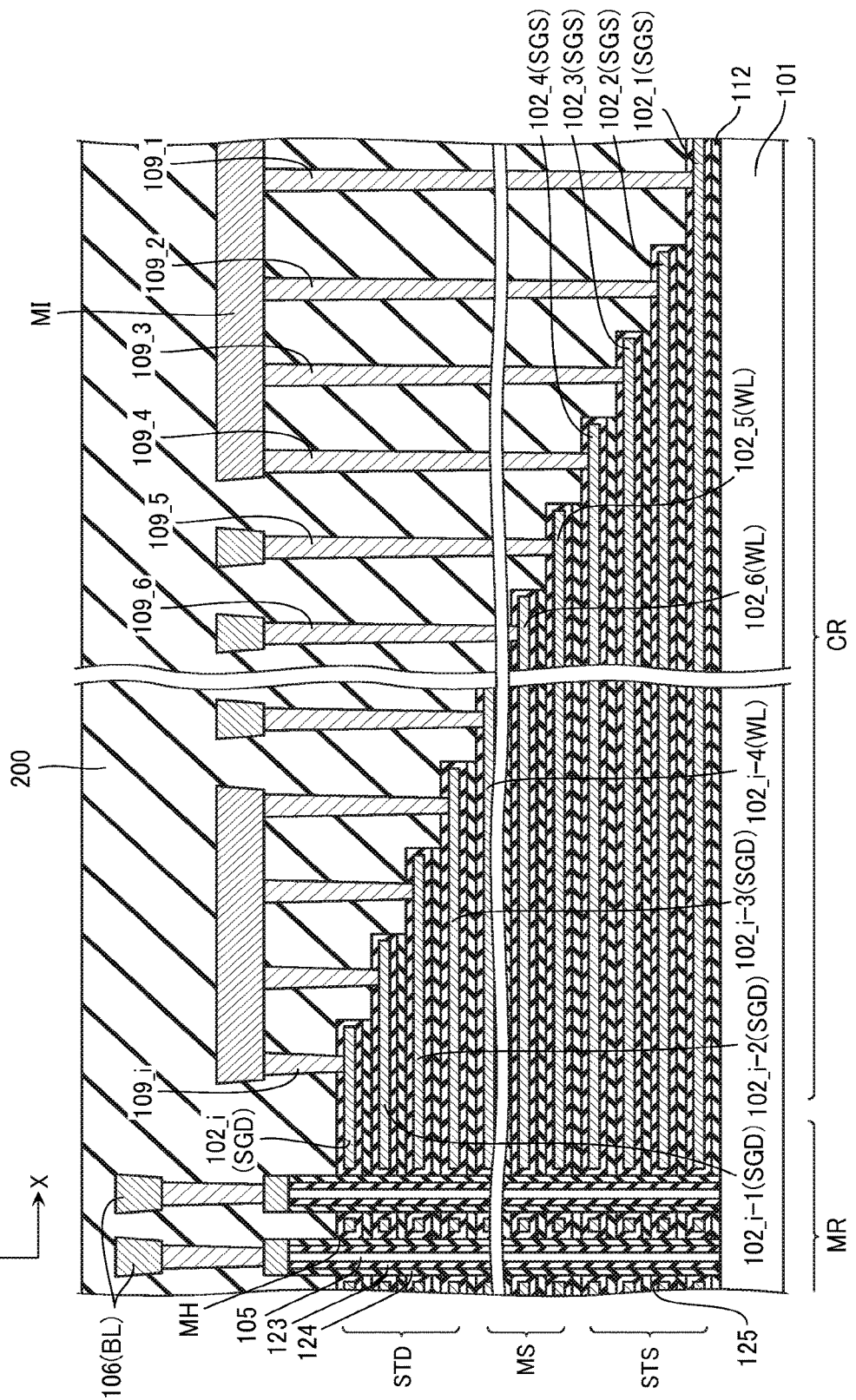
FIG. 6 is a cross-sectional view describing detailed configurations of the memory area MR and the stepped wiring area CR of the semiconductor memory device according to the first embodiment.

Next, with reference to FIG. 5 and FIG. 6, the following describes details of the structure of the memory area MR and the stepped wiring area CR of the semiconductor memory device according to the first embodiment. FIG. 5 is a plan view illustrating the structures of the memory area MR and the stepped wiring area CR. FIG. 6 is a cross-sectional view of the memory area MR and the stepped wiring area CR along the X-Z plane in FIG. 5. FIG. 5 and FIG. 6 differ in the numbers of word lines WL and the selection gate lines SGD and SGS arranged in the laminating direction (Z direction) from those of the schematic diagram in FIG. 2.

As illustrated in FIG. 5, the memory cell array 1 according to the first embodiment includes the memory area MR and the stepped wiring area CR. The memory unit MU is formed at the memory area MR. The stepped wiring area CR extends from the memory area MR.

As illustrated in FIG. 6, in the memory area MR, a plurality of (i pieces) of the conducting layers 102 (102_1 to 102_i) are laminated on the substrate 101 sandwiching the interlayer insulating films 102 and 103.

A large number of memory holes MH are formed in the memory area MR so as to penetrate the laminated body of these conducting layers 102 and interlayer insulating films 102 and 103. In this memory hole MH, the above-described memory columnar body 105 is formed via the tunnel insulating layer 123 and the electric charge accumulating layer 124 (see FIG. 6). That is, the memory columnar body 105 is formed such that the peripheral area of the memory columnar body 105 is surrounded by the laminated body of the conducting layer 102 and the interlayer insulating films 102 and 103.

As illustrated in FIG. 6, the block insulating layers 125 are formed not the inside of the memory holes MH but so as to cover the peripheral areas of the conducting layers 102_1 to 102_i. However, similar to the tunnel insulating layer 123 and the electric charge accumulating layer 124, the block insulating layer 125 may be disposed only the peripheral area of the memory columnar body 105. The upper end of the memory columnar body 105 is connected to the above-described conducting layer 106 (the bit line BL) via a contact wiring or a similar wiring.

In the example illustrated in FIG. 5, the memory holes MH are disposed in a houndstooth pattern in the X-Y plane. The disposition of the memory holes MH in the X-Y direction can be appropriately adjusted into a triangular disposition, a square disposition, or a similar disposition.

As illustrated in FIG. 5 and FIG. 6, a large number of above-described support pillars 111 are formed at the stepped wiring area CR. Contact plugs 109 (109_1 to 109_i) are connected to the exposed portions of the respective conducting layers 102 constituting the stepped wiring area CR. The upper ends of the contact plug 109 are connected to upper layer wirings M1. Through such upper layer wirings M1 and wiring layers (not illustrated), the contact plug 109 is connected to an external circuit. This upper layer wiring M1 functions as the wiring 110 in FIG. 2.

As illustrated in FIG. 6, with the first embodiment, the conducting layers 102_1 to 102_4 function as the source side selection gate line SGS and the control gate electrodes of the source side selection gate transistor STS. That is, in the structure illustrated in FIG. 6, the four source side selection gate lines SGS are connected to the one source side selection transistor STS.

The conducting layers 102_5 to 102_i-4 function as the word lines WL and the control gates of the memory cells MC. That is, in the structure illustrated in FIG. 6, the one memory string MS includes (i-8) pieces of the memory cells MC. (i-8) pieces of the word lines WL are connected to the memory cells MC.

The conducting layers 102_i–3 to 102_i function as the drain side selection gate line SGD and the control gate electrodes of the drain side selection gate transistor STD. That is, in the structure illustrated in FIG. 6, the four drain side selection gate lines SGD are connected to the one drain side selection transistor STD.

The stepped wiring area CR has a structure of forming the above-described conducting layers 102 and interlayer insulating films 113 in a stepped pattern. As a result that the stepped wiring area CR is formed in a staircase pattern, each conducting layer 102 has an exposed part without covered by the upper conducting layers. Each conducting layer 102 is connectable to the contact plug 109 at this exposed part. The upper end of the contact plug 109 is connected to the upper layer wiring M1.

As illustrated in FIG. 5, a large number of slits ST (ST1 and ST2) with the longitudinal direction in the X direction are formed at the memory area MR and the stepped wiring area CR. An interlayer insulating film 113 is embedded or the above-described source contact LI is embedded into the slit ST via the isolation insulating film. That is, by being embedded into the slit ST, the interlayer insulating film 113 has a role to electrically insulate and separate the conducting layer 102 positioned at both sides. When forming the conducting layer 102, this slit ST is formed to remove the sacrificial film, which will be described later, by etching.

As illustrated in FIG. 5, the slit ST extends with the X direction as the longitudinal direction. Additionally, the slit ST is formed so as to separate the laminated body of the conducting layers 102 and the interlayer insulating films 113 from the surface to the bottom. Thus, the slit ST separates the conducting layers 102_2 to 102_i in the memory area MR and the stepped wiring area CR in the Y direction. The slits ST has two types of the slits ST1 and ST2. All the slits ST1 and ST2 are formed to extend from the surface of the conducting layer 102_i to the substrate 101. This slit ST1 divides the memory area MR and the stepped wiring area CR into the plurality of memory blocks MB. Furthermore, the slit ST2 divides the one memory block MB into a plurality of memory fingers MF.

The slit ST1 is a slit formed between the two memory blocks MB. The slit ST2 is a slit formed between the two memory fingers MF in the one memory block MB. The slit ST1 separates the two memory blocks MB up to the conducting layer 102_1, which is the lowermost layer. Meanwhile, the slit ST2 has a terminating end portion STe at any position in the stepped wiring area CR. In the example illustrated in FIG. 5, the terminating end portions STe are formed at the conducting layer 102_i, which is the uppermost layer, and at the conducting layer 102_1, which is the lowermost layer. The slits ST2 are continuously formed opposed to one another sandwiching the terminating end portion in the X direction. In view of this, the slit ST2 does not electrically separate the conducting layers 102 in the adjacent memory fingers MF. The adjacent memory fingers MF are electrically connected to one another at the parts of the terminating end portions STe (More specifically, at the position between the two terminating end portions STe disposed alongside in the X direction, the conducting layer 102 disposed at a first side viewed from the slit ST2 in the Y direction, and the conducting layer 102 disposed at a second side viewed from the slit ST2 in the Y direction, are electrically connected).

Thus, the reason the slits ST2 have the terminating end portions STe is as follows. The plurality of memory fingers MF included in the one memory block MB are not electrically separated but remain to be connected to reduce the number of required contact plugs. Obviously, the positions where the terminating end portions STe are formed are not limited to the example illustrated in the drawing. For example, the terminating end portion STe may be formed on the conducting layer 102_i, which is on the lowermost layer, only.

As illustrated in FIG. 6, an interlayer insulating film 200 covers the above-described laminated structure. In this embodiment, the interlayer insulating film 200 is composed of a plasma TEOS film using tetraethoxysilane ($Si(OC_2H_5)_4$ gas: hereinafter referred to as "TEOS gas") as the raw material gas. The interlayer insulating film 200 includes boron as impurities. The concentration of the boron in the interlayer insulating film 200 is set to be 5.5E21 to 8.5E21 (atom/cm$^3$). The interlayer insulating film 200 according to the embodiment is allowed to be generated by a plasma CVD method using gas that includes the TEOS gas and triethylborate ($B(OC_2H_5)_3$ gas: hereinafter referred to as "TEB gas") at a predetermined proportion as the raw material gas. As described above, the interlayer insulating film 200 is formed to cover the laminated body of the plurality of conducting layers 102 and interlayer insulating films 112 and 113. Then, the interlayer insulating film 200 has a film thickness of equal to or more than 3 μm. When the number of the laminate increases, the film thickness of the interlayer insulating film 200 may reach equal to or more than 4 μm. The more the film thickness of the interlayer insulating film 200 increases, the more likely that the laminated structure including the interlayer insulating film 200 has inadmissible warping. However, according to the embodiment, the interlayer insulating film 200 contains boron at predetermined concentration to restrain this warping.

Next, a description will be given of a manufacturing method of the semiconductor memory device according to the first embodiment with reference to FIG. 7A to FIG. 7F.

As described later, the laminated body of the conducting layers 102 and the interlayer insulating films 102 and 103 is formed as follows. First, the interlayer insulating films and the sacrificial films are laminated in alternation, and the sacrificial films are removed. After that, the conducting layers 102 are embedded to the voids (the air gaps) from which the sacrificial films have been removed. From an aspect of reduction in its resistivity, the conducting layer 102 is preferably formed of a metal film such as tungsten as a material. However, it is not easy to form the memory hole MH, which penetrates the tungsten and silicon oxide films, at a high density. In view of this, as described below, the laminated body of the conducting layers 102, which are formed of the metal films, and the interlayer insulating films 103 is formed as follows. The interlayer insulating films and the sacrificial films are laminated in alternation, and the sacrificial films are removed. After that, the conducting layers 102 are embedded into the voids from which the sacrificial films have been removed. The following describes the processes in detail with reference to FIG. 7A to FIG. 7F.

Figure 7A:
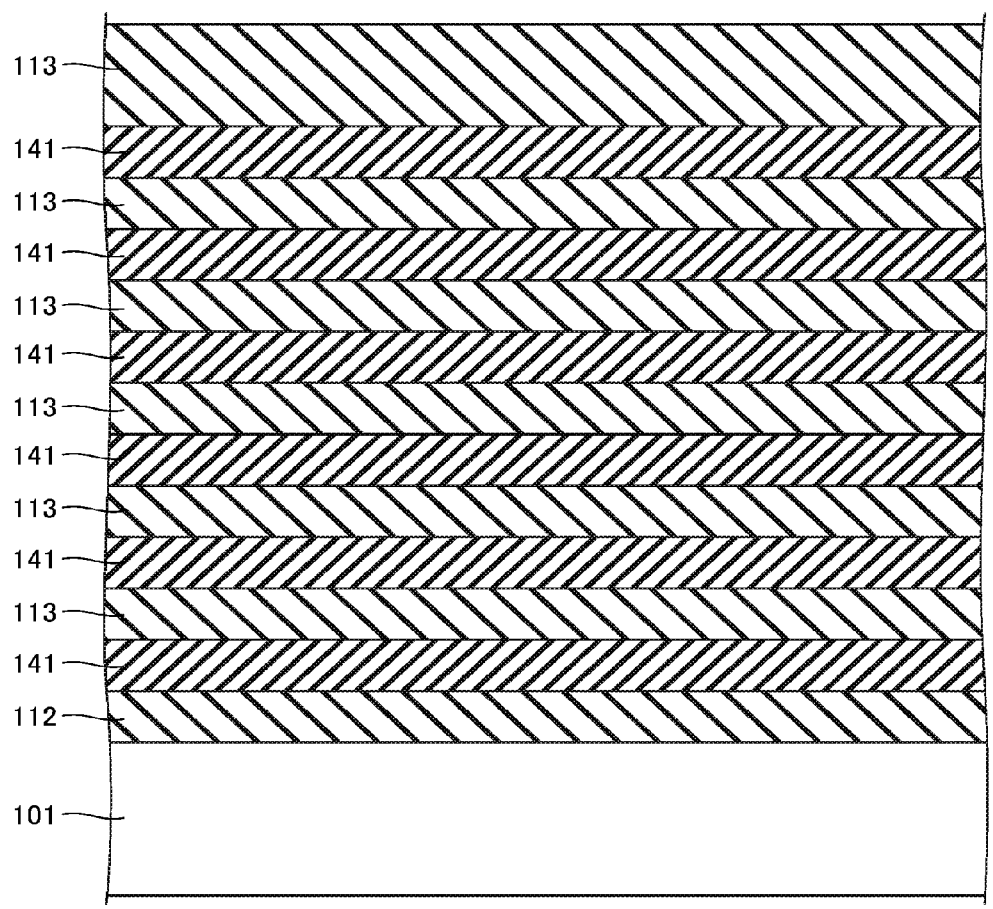

First, as illustrated in FIG. 7A, the interlayer insulating films 112 and 113 are laminated sandwiching a sacrificial layer 141 between them above the semiconductor substrate 101. When forming the interlayer insulating films 112 and 113 with silicon oxide film, the sacrificial layer 141 can be consisted of silicon nitride film (SiN).

Figure 7B:
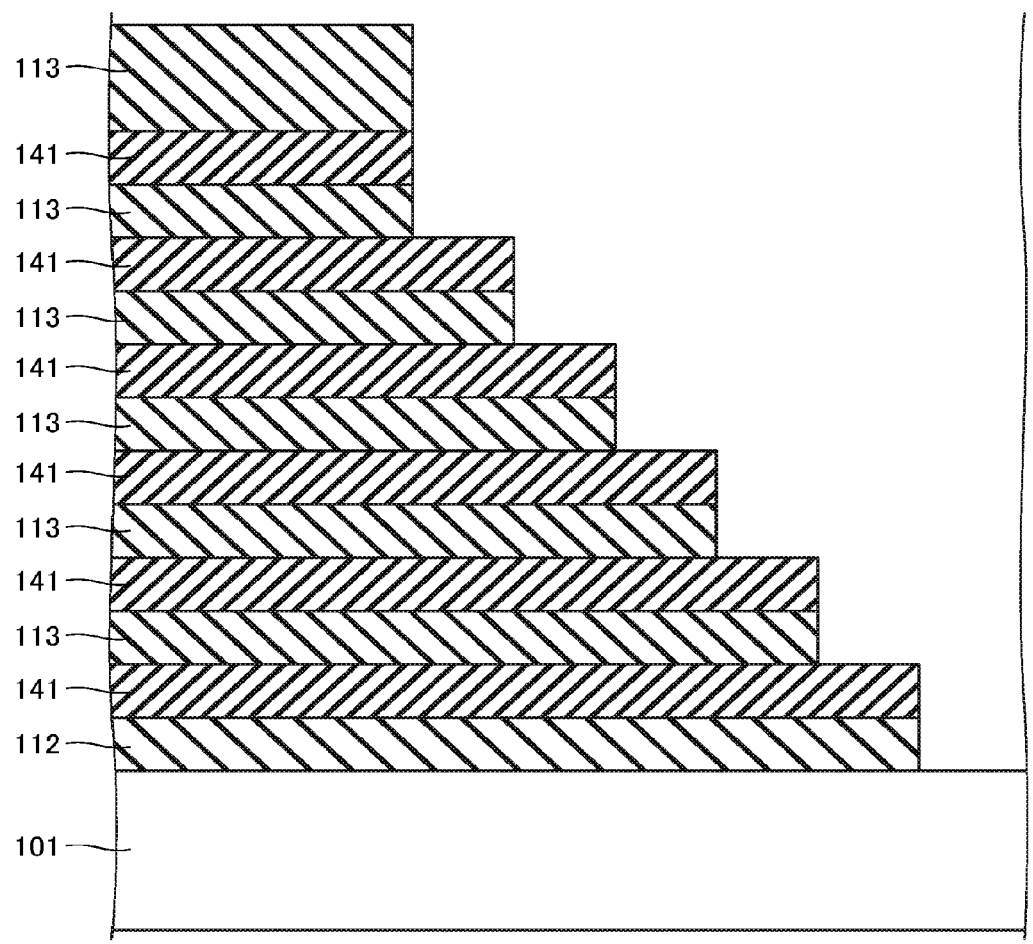

Then, as illustrated in FIG. 7B, on the top surface of the uppermost interlayer insulating film 113, a resist (not illustrated) is applied over, and while a slimming process is performed gradually to the resist, an etching process is performed to the sacrificial layer 141 and the interlayer insulating films 112 and 113. As illustrated in FIG. 7B, this provides a step shape to the end portion of the laminated body of the sacrificial layer 141 and the interlayer insulating films 112 and 113. This step-shaped portion is the above-described stepped wiring area CR.

Figure 7C:
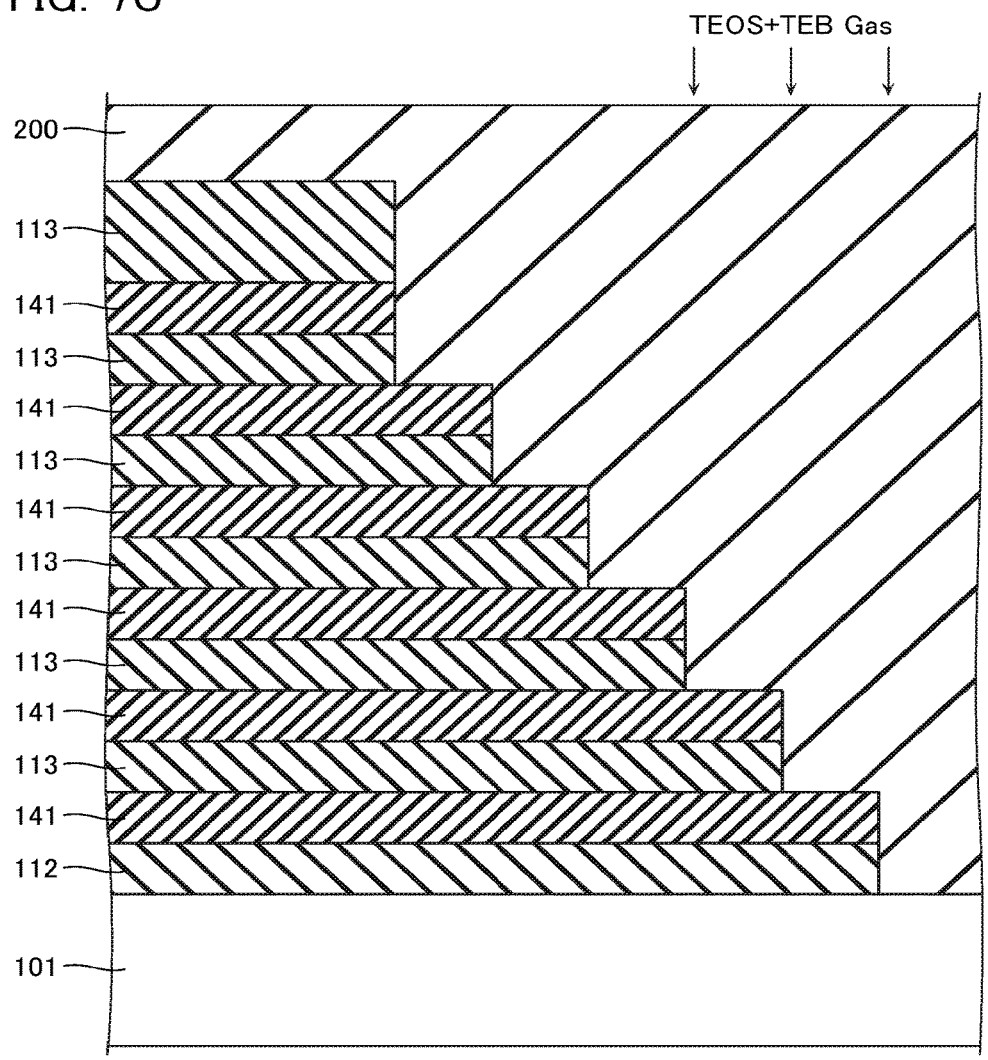

Then, as illustrated in FIG. 7C, the interlayer insulating film 200 is deposited to bury this laminated body. The interlayer insulating film 200 may be deposited by the plasma CVD method that uses the raw material gas including the TEOS gas and the TEB gas at the predetermined proportion. Controlling the proportion of the TEB gas appropriately ensures to set the concentration of boron (B) in the interlayer insulating film 200 to be 5.5E21 to 8.5E21 (atom/$cm^3$).

Figure 7D:
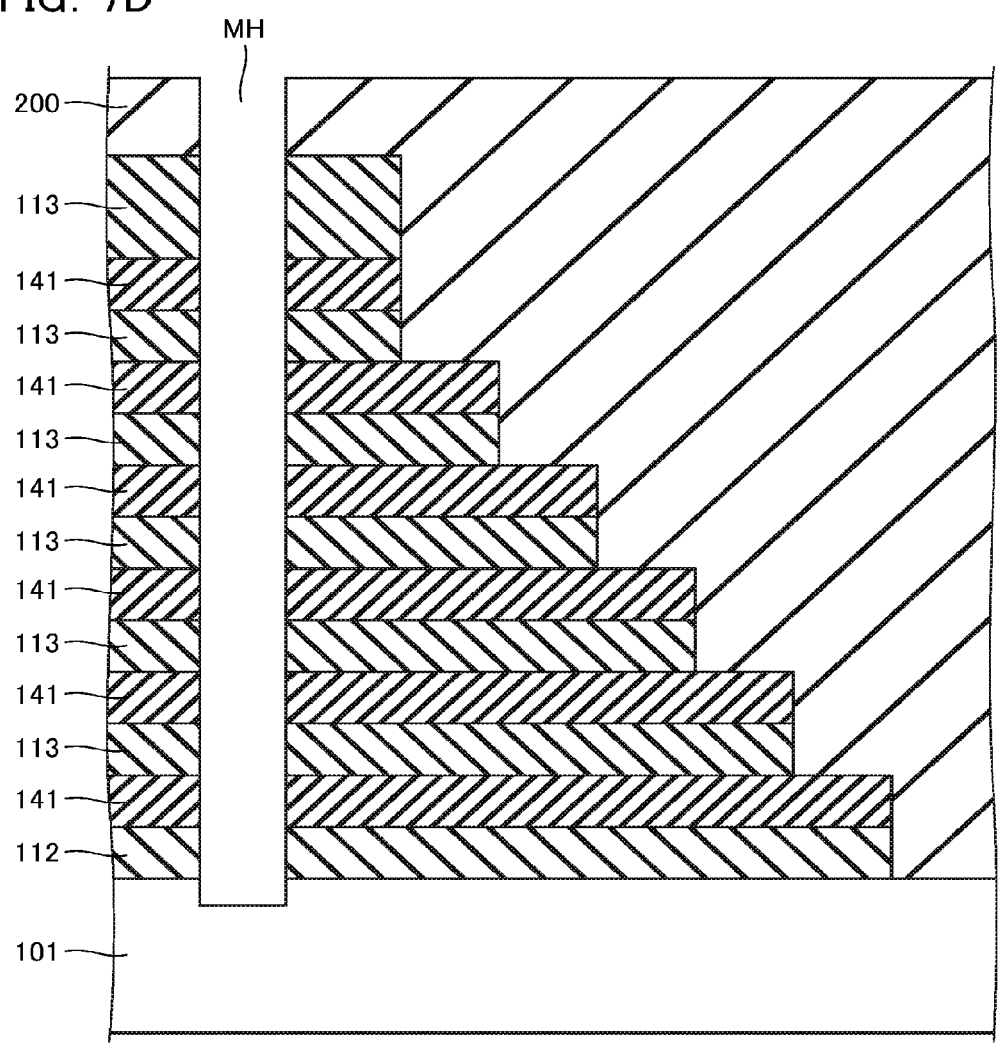

Then, as illustrated in FIG. 7D, the memory hole MH is formed at a part where the memory area MR is to be formed in the laminated body of the sacrificial layer 141 and the interlayer insulating films 112 and 113, using the techniques of photolithography and etching.

Further, as illustrated in FIG. 7E, on the sidewall of this memory hole MH, the above-described electric charge accumulating layer 124 and tunnel insulating layer 123 are deposited in this order using the plasma CVD method and similar method. Then, the above-described memory columnar body 105 is formed so as to fill inside the memory hole MH. This forms the memory unit MU. While the drawing is omitted, the above-described support pillar 111 is formed at this process similar to the memory unit MU. The memory columnar body 105 is formed as follows, for example. After amorphous silicon is deposited, a predetermined thermal process is performed to cause the amorphous silicon to be crystallized to form the memory columnar body 105.

After the memory unit MU is formed, RIE is performed to form the slits ST1 and ST2 (see FIG. 5) passing through the interlayer insulating film 112 and 113 and the sacrificial layer 141. Then, wet etching is performed using hot phosphoric acid solution via the slits ST1 and ST2. This removes the sacrificial layer 141 as illustrated in FIG. 7F. At the gap where the sacrificial layer 141 is removed, an air gap AG is formed. Then, a CVD method or similar method is used to the wall surface of the air gap AG to form the block insulating layer 125 until reaching a predetermined film thickness. Afterwards, metal such as tungsten is implanted to the remaining air gap AG to complete the laminated structure illustrated in FIG. 6. In the slits ST1 and ST2, the insulating film such as the silicon oxide film is formed, or the conductive film (tungsten or similar material) constituting the source contact LI is implanted via the sidewall film such as the silicon insulating film.

Figure 8:
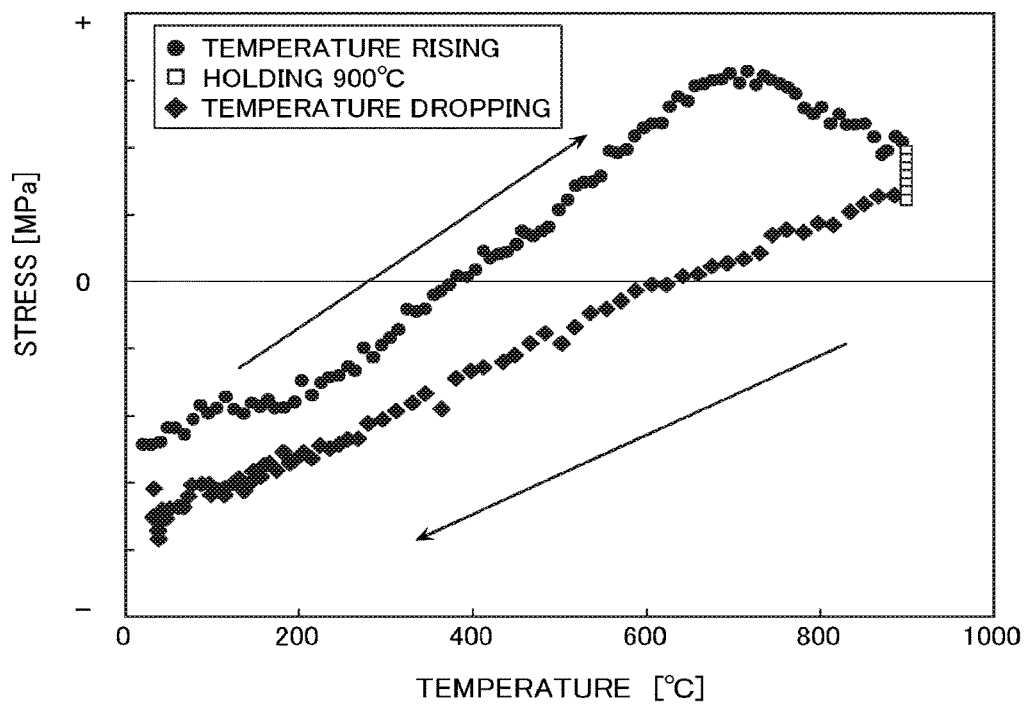
FIG. 8 is a graph showing the change of the stress to the laminated structure according to a comparative example.

As described above, according to the embodiment, the concentration of boron (B) in the interlayer insulating film 200 is set to be 5.5E21 to 8.5E21 (atom/$cm^3$) as described by FIG. 7C. The graph illustrated in FIG. 8 indicates a change of the stress of the overall construction in the case where the structure illustrated in FIG. 5 and FIG. 6 is constituted without doping boron to the interlayer insulating film 200.

In the case where the interlayer insulating film 200 is deposited without doping boron (comparative example), the laminated structure warps largely because of the reason described below. Performing the thermal process to this construction raises the temperature of the construction. At this time, when the temperature rises to, for example, approximately 400° C., the stress of the overall construction varies from the compressive stress (positive value) to the tensile stress (negative value). Then, when the temperature reaches to, for example, nearly 600° C., water is removed from the interlayer insulating film 200. This causes the stress of the interlayer insulating film 200 to increase (the gradient gets large) more in the negative direction (the direction in the tensile stress). Then, subsequently to the termination of the removal of water to a certain extent, the rearrangement of the silicon oxide in the interlayer insulating film starts. This causes the stress of the interlayer insulating film 200 to vary inversely in the negative direction. Then, when the thermal process is terminated and the temperature of the construction falls, the stress of the overall construction approaches to the original value (the direction in the compressive stress). However, the value of the stress never returns to the original value because of the influence of the above-described water removal and the rearrangement of the silicon oxide.

On the other hand, according to the embodiment, the gas containing boron, for example, TEB gas is doped to the interlayer insulating film 200 in depositing the interlayer insulating film 200. This causes the concentration of boron in the finally deposited interlayer insulating film 200 to be set to be 5.5E21 to 8.5E21 (atom/$cm^3$). This boron doping restricts the above-described rearrangement of the silicon oxide to restrict the change of the stress generated by the laminate material. As the result, this allows the laminated structure after the thermal process is terminated to reduce its warping.

Figure 9:
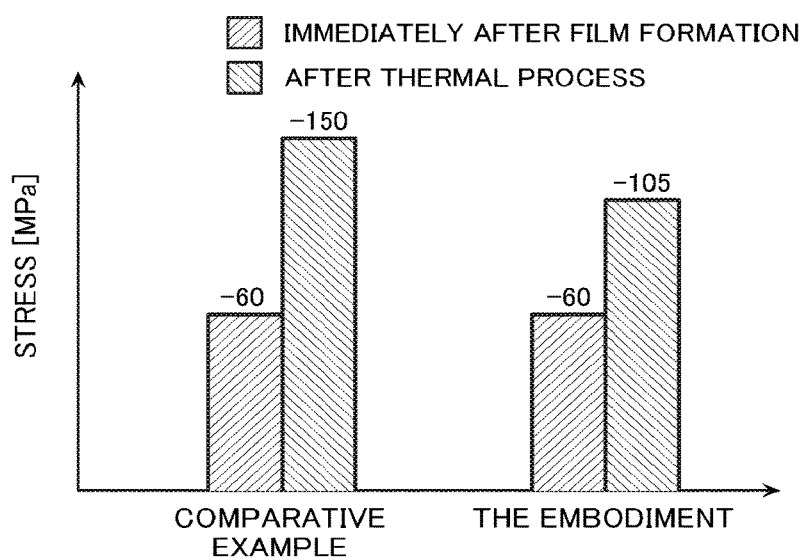
FIG. 9 is a graph showing the change of the stress to the laminated structure according to the comparative example and the first embodiment.

FIG. 9 illustrates a graph comparing a case without doping boron to the interlayer insulating film 200 (comparative example) with a case with doping boron to the interlayer insulating film 200 (the embodiment). With respect to each of the comparative example and the embodiment, the stress of the laminated structure immediately after the film formation of the interlayer insulating film 200 and the stress of the laminated structure after performing the thermal process are indicated in the bar chart.

According to the comparative example, the difference of the stress is large between immediately after the film formation of the interlayer insulating film 200 and after performing the thermal process. This causes the laminated structure to warp significantly. On the other hand, according to the embodiment, the difference of the stress is equal to or less than half compared with the comparative example between immediately after the film formation of the interlayer insulating film 200 and after performing the thermal process. This ensures the warping of the laminated structure to be reduced remarkably compared with the comparative example.

Second Embodiment

Figure 10:
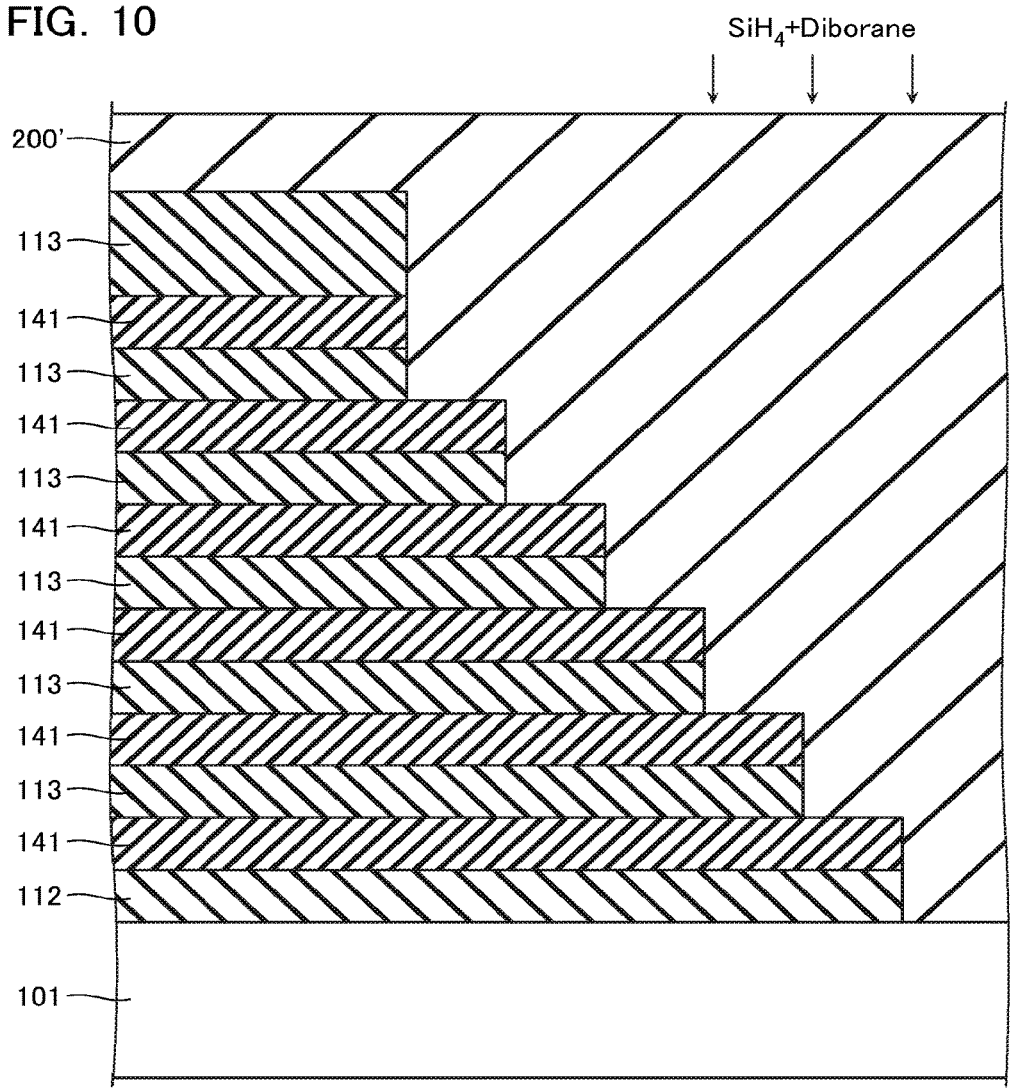
FIG. 10 is a conceptual diagram describing the manufacturing process of a semiconductor memory device of a second embodiment.

Next, a description will be given of a semiconductor memory device according to a second embodiment with reference to FIG. 10. The semiconductor memory device according to the second embodiment employs a configuration of an interlayer insulating film 200' different from the configuration of the interlayer insulating film 200 according to the first embodiment. The other configuration is similar to the first embodiment. Therefore, the overlapped description will not be further elaborated here.

The interlayer insulating film 200' according to the second embodiment is a plasma silane film deposited by the plasma CVD method, which uses silane gas ($SiH_4$) as the raw material gas. This interlayer insulating film 200' contains boron as impurities similar to the interlayer insulating film 200 according to the first embodiment. The concentration of boron in the interlayer insulating film 200' can be set to be 5.5E21 to 8.5E21 (atom/$cm^3$) similar to the first embodiment. The plasma CVD method, which uses raw material gas containing silane (SiH$_4$) gas and diborane (B$_2$H$_6$) gas at the predetermined proportion, can be employed to deposit the interlayer insulating film 200'.

The second embodiment can provide effects similar to those in the first embodiment.

OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

While, in the above-described embodiments, the process where the sacrificial layer 141 is replaced with the conductive layer 102 after performing the etching removal is described, the manufacturing method of the device according to the embodiments should not be construed in a limiting sense. Without above-described etching removal of the sacrificial layer 141 and replacement to the conducting layer, a method as follows may be employed: for example, a conducting layer constituted of polysilicon to which impurities are doped and an interlayer insulating layer are laminated in alternation, and the conducting layer constituted of polysilicon is used as the conductive layer 102.

What is claimed is:

1. A semiconductor device comprising:
   a semiconductor substrate;
   a laminated body including a plurality of conducting layers and a first interlayer insulating film, the plurality of the conducting layers being disposed above the semiconductor substrate, the first interlayer insulating film being disposed between the plurality of the conducting layers, and an end of the laminated body being formed into a stepped pattern in a stepped wiring area; and
   a second interlayer insulating film that covers a side surface of the laminated body in the stepped wiring area, wherein
   the second interlayer insulating film contains boron.

2. The semiconductor device according to claim 1, wherein
   the concentration of boron in the second interlayer insulating film is 5.5E21 to 8.5E21 (atom/cm$^3$).

3. The semiconductor device according to claim 1, wherein
   the conducting layers employ tungsten as material.

4. The semiconductor device according to claim 3, wherein
   the concentration of boron in the second interlayer insulating film is 5.5E21 to 8.5E21 (atom/cm$^3$).

5. The semiconductor device according to claim 1, wherein
   the second interlayer insulating film includes a plasma TEOS film that employs tetraethoxysilane (TEOS) gas as raw material gas.

6. The semiconductor device according to claim 5, wherein
   the concentration of boron in the second interlayer insulating film is 5.5E21 to 8.5E21 (atom/cm$^3$).

7. The semiconductor device according to claim 5, wherein
   the conducting layers employ tungsten as material.

8. The semiconductor device according to claim 7, wherein
   the concentration of boron in the second interlayer insulating film is 5.5E21 to 8.5E21 (atom/cm$^3$).

9. The semiconductor device according to claim 1, wherein
   the second interlayer insulating film has a film thickness of equal to or more than 3 μm.

10. The semiconductor device according to claim 9, wherein
    the concentration of boron in the second interlayer insulating film is 5.5E21 to 8.5E21 (atom/cm$^3$).

11. The semiconductor device according to claim 1, wherein
    the second interlayer insulating film includes a plasma silane film that employs silane (SiH4) gas as raw material gas.

12. The semiconductor device according to claim 11, wherein
    the concentration of boron in the second interlayer insulating film is 5.5E21 to 8.5E21 (atom/cm$^3$).

13. The semiconductor device according to claim 11, wherein
    the conducting layers employ tungsten as material.

14. The semiconductor device according to claim 13, wherein
    the concentration of boron in the second interlayer insulating film is 5.5E21 to 8.5E21 (atom/cm$^3$).

15. A manufacturing method of a semiconductor device, comprising:
    forming a laminated body above a semiconductor substrate, the laminated body including a conducting layer and a first interlayer insulating film laminated in alternation;
    forming an end of the laminated body into a stepped pattern in a stepped wiring area;
    depositing a second interlayer insulating film covering a side surface of the laminated body in the stepped wiring area; and
    doping boron as impurities in forming the second interlayer insulating film.

16. The manufacturing method of the semiconductor device according to claim 15, wherein
    the concentration of boron in the second interlayer insulating film is 5.5E21 to 8.5E21 (atom/cm$^3$).

17. The manufacturing method of the semiconductor device according to claim 15, wherein
    the conducting layer employs tungsten as material.

18. The manufacturing method of the semiconductor device according to claim 17, wherein
    the concentration of boron in the second interlayer insulating film is 5.5E21 to 8.5E21 (atom/cm$^3$).

19. The manufacturing method of the semiconductor device according to claim 15, wherein
    the second interlayer insulating film is deposited by using triethylborate (B(OC2H5)3) gas as raw material gas.

20. The manufacturing method of the semiconductor device according to claim 15, wherein
    the second interlayer insulating film is deposited by using diborane (B$_2$H$_6$) gas as the raw material gas.

* * * * *